United States Patent [19]

Hasegawa et al.

[11] Patent Number: 5,436,949
[45] Date of Patent: Jul. 25, 1995

[54] CHARGE TRANSFER APPARATUS

[75] Inventors: Kenji Hasegawa; Junya Suzuki, both of Kanagawa, Japan

[73] Assignee: Sony Corporation, Tokyo, Japan

[21] Appl. No.: 333,232

[22] Filed: Nov. 2, 1994

Related U.S. Application Data

[63] Continuation of Ser. No. 45,213, Apr. 14, 1993, abandoned.

[30] Foreign Application Priority Data

Apr. 16, 1992 [JP] Japan .................. 4-096781
Dec. 28, 1992 [JP] Japan .................. 4-348236

[51] Int. Cl.[6] ............... G11C 19/28; H03K 23/46
[52] U.S. Cl. ........................ 377/60; 257/239; 257/402; 257/403
[58] Field of Search ............ 357/239, 402–403; 377/60

[56] References Cited

U.S. PATENT DOCUMENTS 5,247,554  9/1993  Yamado .................. 377/60

FOREIGN PATENT DOCUMENTS 0272688  12/1987  European Pat. Off. .
0480412A2  10/1991  European Pat. Off. .

Primary Examiner—Margaret Rose Wambach
Attorney, Agent, or Firm—Hill, Steadman & Simpson

[57] ABSTRACT

The present invention is directed to a charge transfer apparatus. A reset gate (RG) is formed of an N-channel MOSFET of depletion type in which a carrier concentration of a channel region is set in a range from $10^{15}$ to $5 \times 10^{16}$ cm$^{-3}$. Also, a circuit for generating a reset pulse that is supplied to the reset gate (RG) is constructed as follows. A drain voltage source (12) and a drain of a transistor (Tr) are connected via a junction (a), and two resistors (R1) and (R2) are connected in series between the anode of the drain voltage source (12) and the ground. A junction (b) between the resistors (R1) and (R2) and the reset gate (RG) are connected together via an input line (13) and a high resistance (Rh) is inserted into the input line (13). Further, a coupling capacitor (Cc) is connected between a clock pulse input terminal ($\phi$in) and the input line (13). Thus, an amount that a potential formed under the reset gate is fluctuated by a fluctuation of an amount of implanted impurities and a fluctuation of a drain voltage can be reduced and hence a stable reset operation can be carried out.

16 Claims, 8 Drawing Sheets

CHARGE TRANSFER APPARATUS

This is a continuation, of application Ser. No. 08/045,213 filed Apr. 14, 1993, now abandoned.

BACKGROUND OF THE INVENTION

1. Field of the Invention

The present invention generally relates to charge transfer apparatus and, more particularly, to a charge transfer apparatus having a so-called floating diffusion amplifier that converts a signal charge from a charge transfer section formed of a CCD (charge-coupled device) into an output voltage.

2. Description of the Prior Art

FIG. 1 of the accompanying drawings shows a structure of a main portion (output section) of a CCD solid state imager device according to the prior art. As shown in FIG. 1, the conventional CCD solid state imager device, particularly, its output section comprises a charge transfer section 21 formed of a CCD, a discharge element 22 composed of a floating diffusion FD, a reset gate RG and a drain region (hereinafter referred to as a reset drain, if necessary) RD connected to the next stage of the charge transfer section 21 through an output gate OG and an output amplifier 23 formed of an output element Q1 and a load resistance element Q2 connected to the next stage of the discharge element 22.

A signal charge transferred from below a transfer gate electrode TG of the final stage of the charge transfer section 21 is temporarily accumulated in the floating diffusion FD. Then, the voltage change based on the accumulated electric charges is supplied to the output amplifier 23 of the succeeding stage, thereby being output from an output terminal φout of the output amplifier 23 as an output voltage S.

After the output voltage S was generated from the output terminal φout of the output amplifier 23, a reset pulse Pr is supplied to the reset gate RG, whereby the floating diffusion FD is reset to a drain voltage Vdd and electric charges accumulated in the floating diffusion FD are discharged to the reset drain RD side.

In the conventional CCD solid state imager device, the reset gate RG is formed of a MOSFET (metal oxide semiconductor field effect transistor) of a depletion type having a channel region 24 whose carrier concentration (donor impurity concentration) exceeds $5 \times 10^{16}$ cm$^{-3}$. As a consequence, an amount that a potential formed under the reset gate RG is fluctuated when an amount of implanted donor impurities and the drain voltage Vdd supplied to the reset drain RD are fluctuated is considerably increased. Therefore, a driving range of the reset gate RG must be widened by increasing a margin of an amplitude of the reset pulse Pr supplied to the reset gate RG or a low level of the reset pulse Pr must be designated at every device.

When the reset gate RG is formed of a MOSFET of an enhancement type, the donor impurity need not be implanted into the channel region 24. Therefore, an amount that the potential formed under the reset gate RG is fluctuated is reduced (in this case, the potential is fluctuated only by the fluctuation of the drain voltage Vdd). However, the high level of the reset pulse Pr exceeds the level of the drain voltage Vdd so that electric charges accumulated in the floating diffusion FD and electric charges accumulated in the drain region RD are implanted under the reset gate RG. There is then the disadvantage such that the charge transfer apparatus is degraded in reliability.

OBJECTS AND SUMMARY OF THE INVENTION

Therefore, it is an object of the present invention to provide an improved charge transfer apparatus in which the aforesaid shortcomings and disadvantages encountered with the prior art can be eliminated.

More specifically, it is an object of the present invention to provide a charge transfer apparatus in which an amount that a potential formed under a reset gate is fluctuated by a fluctuation of an amount of implanted impurities and a fluctuation of a drain voltage can be reduced to thereby reduce a driving range of the reset gate.

It is another object of the present invention to provide a charge transfer apparatus in which a stable reset operation can be carried out.

According to a first aspect of the present invention, there is provided a charge transfer apparatus which comprises a charge transfer section for transferring signal charges in a direction, an output diode having a first terminal connected to the charge transfer section and a second terminal connected to a first voltage, the output diode for receiving the signal charges from the charge transfer section, an amplifier for receiving the signal charges from the output diode and outputting an output voltage corresponding to the signal charges, a reset device connected between the first terminal of the output diode and a voltage source, the reset device having a gate terminal receiving a reset voltage thereby to reset the first terminal of the output diode to a predetermined potential, and a clamp circuit having an input terminal receiving a reset pulse voltage, the clamp circuit for clamping the reset pulse voltage at a clamp voltage level corresponding to a voltage level of the voltage source and outputting the reset pulse voltage to the gate terminal.

According to a second aspect of the present invention, there is provided a charge transfer apparatus which comprises a charge transfer section for transferring signal charges in a direction, an output diode having a first terminal connected to the charge transfer section and a second terminal connected to a first voltage, the output diode for receiving the signal charges from the charge transfer section, an amplifier for receiving the signal charges from the output diode and outputting an output voltage corresponding to the signal charges, an MIS transistor of a depletion type connected between the first terminal of the output diode and a voltage source, the MIS transistor having a gate terminal receiving a reset voltage thereby to reset the first terminal of the output diode to a predetermined potential, and a clamp circuit comprising an input terminal receiving a reset pulse voltage, a condenser having a first node connected to the input terminal and a second node connected to the gate terminal, a resistance connected between the second node and the voltage source, and a clamp diode connected between the second node and the voltage source, the clamp circuit for clamping the reset pulse voltage at a clamp voltage level corresponding to a voltage level of the voltage source and outputting the reset pulse voltage to the gate terminal.

As a third aspect of the present invention, there is provided a reset circuit for a floating diffusion which comprises a floating diffusion for accumulating signal charges therein, a reset device connected between the floating diffusion and a voltage source, the reset device having a gate terminal receiving a reset voltage thereby to reset the floating diffusion to a predetermined potential, a clamp circuit having an input terminal receiving a reset pulse voltage, the clamp circuit for clamping the reset pulse voltage at a clamp voltage level corresponding to a voltage level of the voltage source and outputting the reset pulse voltage to the gate terminal.

The above and other objects, features, and advantages of the present invention will become apparent in the following detailed description of illustrative embodiments thereof to be read in conjunction with the accompanying drawings, in which like reference numerals are used to identify the same or similar parts in the several views.

DETAILED DESCRIPTION OF THE PREFERRED EMBODIMENTS

Embodiments of the present invention will hereinafter be described with reference to FIG. 2 to FIGS. 11A through 11C.

Figure 1:
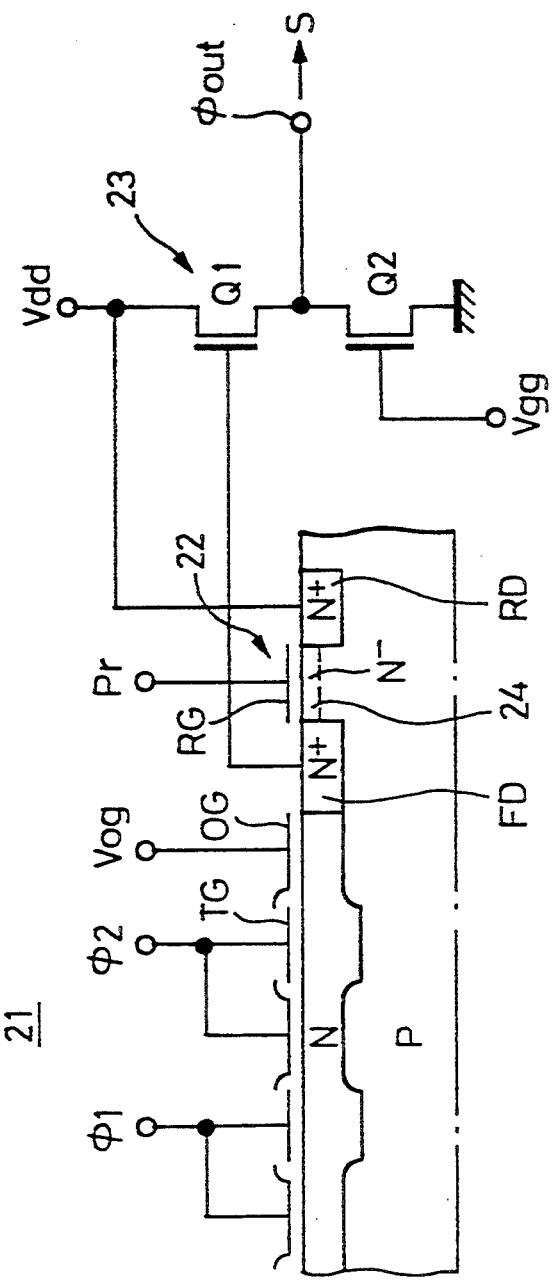
FIG. 1 is a diagram showing a structure of a main portion (output section) of a CCD solid state imager device according to the prior art.
Figure 2:
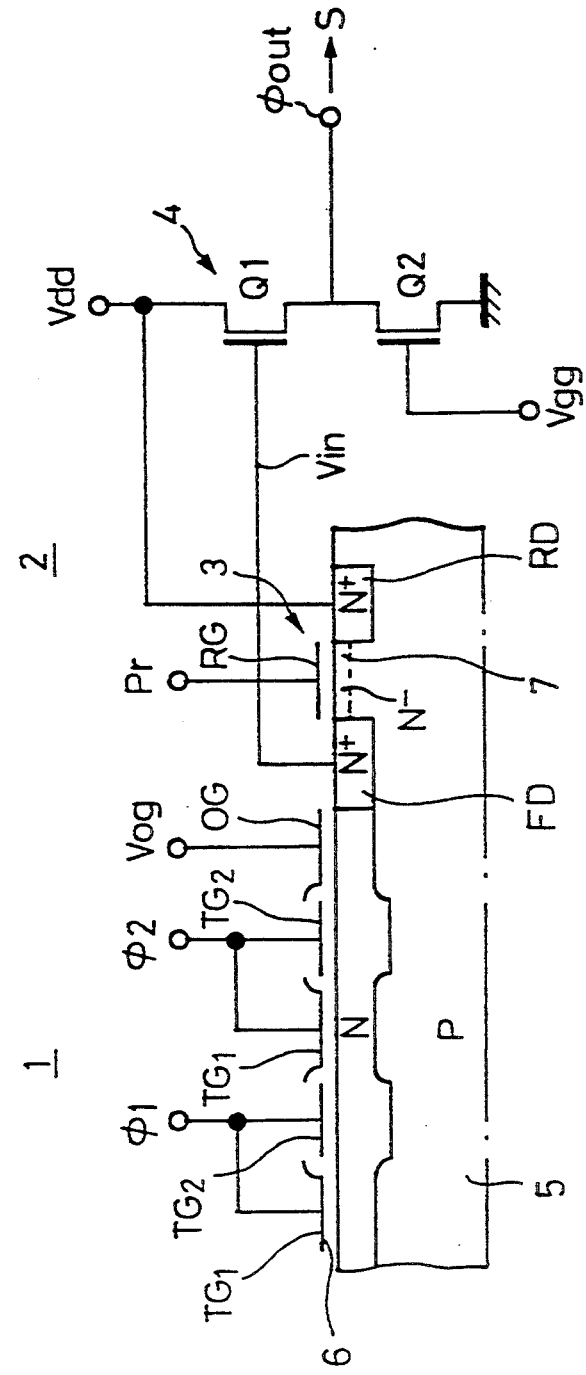
FIG. 2 is a diagram showing a structure of a main portion (output section) of a CCD imager device according to an embodiment of the present invention.

FIG. 2 is a diagram illustrative of a structure of a main portion (output section) of a CCD solid state imager device according to the embodiment of the present invention.

As shown in FIG. 2, the CCD solid state imager device includes a so-called FDA (floating diffusion amplifier) 2 which converts a signal charge from a charge transfer section (horizontal register in the illustrated example) 1 formed of a CCD into an output voltage.

More specifically, the CCD solid state imager device of this embodiment comprises the charge transfer section 1, a discharge element 3 formed of a floating diffusion FD, a reset gate RG and a drain region (hereinafter referred to as a reset drain, if necessary) RD connected to the next stage of the charge transfer section 1 through an output gate OG and an output amplifier 4 formed of a source-follower circuit formed of at least an output element Q1 and a load resistance element Q2 connected to the next stage of the discharge element 3. Each of the output element Q1 and the load resistance element Q2 is formed of an N-channel MOSFET, for example. In FIG. 2, reference numeral 5 designates a P-type silicon substrate and 6 a gate insulating film.

The charge transfer section 1 sequentially transfers signal charges from light sensing sections or vertical registers in response to two-phase clock pulses $\phi 1$ and $\phi 2$ of different phases applied to a set of adjacent two transfer gate electrodes.

A signal charge transferred from the transfer gate electrode $TG_2$ of the final stage of the charge transfer section 1 is temporarily accumulated in the floating diffusion FD. Then, a voltage change based on such accumulated electric charges is supplied to the output amplifier 4 of the succeeding stage as an input voltage Vin, thereby being delivered from an output terminal $\phi$out of the output amplifier 4 as an output voltage S. After the output voltage S was output from the output terminal $\phi$out, a reset pulse Pr is supplied to the reset gate RG, whereby the floating diffusion FD is reset to an initial voltage, i.e., a drain voltage Vdd. Thus, signal charges accumulated in the floating diffusion FD are discharged to the reset drain RD side.

According to this embodiment, the reset gate RG is formed of a MOSFET of a depletion type. In this case, a channel region 7 under the reset gate RG is formed of an N-type impurity diffusion region whose carrier concentration (donor impurity concentration) lies in a range of from $10^{15}$ to $5 \times 10^{16}$ cm$^{-3}$. With this structure, a source-gate threshold voltage Vth of the MOSFET is presented as Vth > −1 V (Volt). A conventional source-gate threshold voltage Vth is presented as Vth > −6 V.

Figure 3:
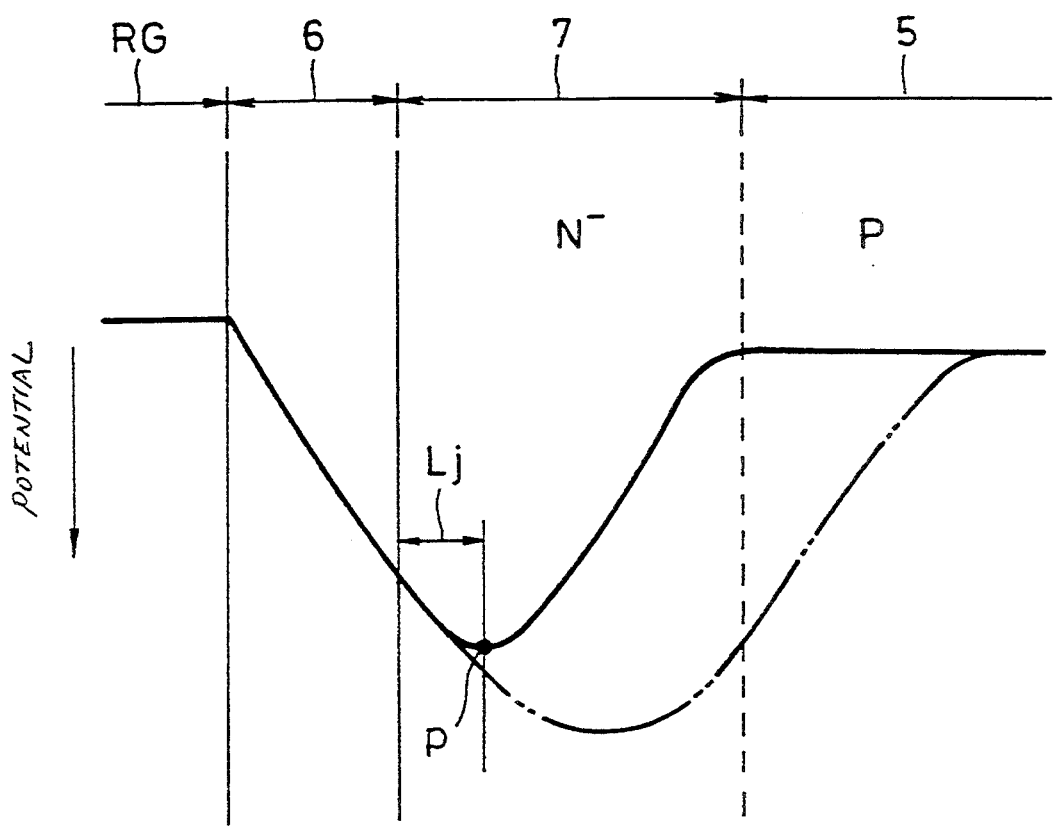
FIG. 3 is a potential diagram of a channel region formed under a reset gate according to the embodiment of the present invention.

The channel region 7 is formed by implanting donor impurities into a nearby portion of the surface of the silicon substrate 5 such that a depth Lj of a minimum potential point p becomes less than 0.15 μm as shown in FIG. 3. In this embodiment, by the ion implantation process in which an implantation energy was about 200 keV, donor impurities, e.g., arsenic (As) were implanted to form the channel region 7. A potential distribution shown by a two-dot chain line in FIG. 3 represents a potential formed when the implantation of donor impurities is effected on the conventional channel region. Study of FIG. 3 reveals that, in this embodiment, the donor impurity is implanted on the region sufficiently shallower than that of the prior art.

Since the reset gate RG of this embodiment is formed of the MOSFET of depletion type as described above, the high level of the reset pulse Pr supplied to the reset gate RG can be set to be lower than the drain voltage Vdd supplied to the reset drain RD. Therefore, as a reset pulse forming circuit that forms the reset pulse Pr, there can be used a reset pulse forming circuit 11 that forms the reset pulse Pr by utilizing the drain voltage Vdd as shown in FIG. 4, for example.

Fundamentally, the reset pulse forming circuit 11 divides the drain voltage Vdd to a predetermined voltage Vc and superimposes a clock pulse Pc having the same output timing as that of the reset pulse Pr upon the voltage Vc thereby to form the reset pulse Pr.

A circuit arrangement of this reset pulse forming circuit 11 will be described below with reference to FIG. 4. As shown in FIG. 4, a transistor Tr is formed of a MOSFET of a depletion type having the reset gate RG. A diode connected to the source of the transistor Tr represents the floating diffusion FD. In FIG. 4, reference numeral 12 designates a drain voltage source.

Figure 4:
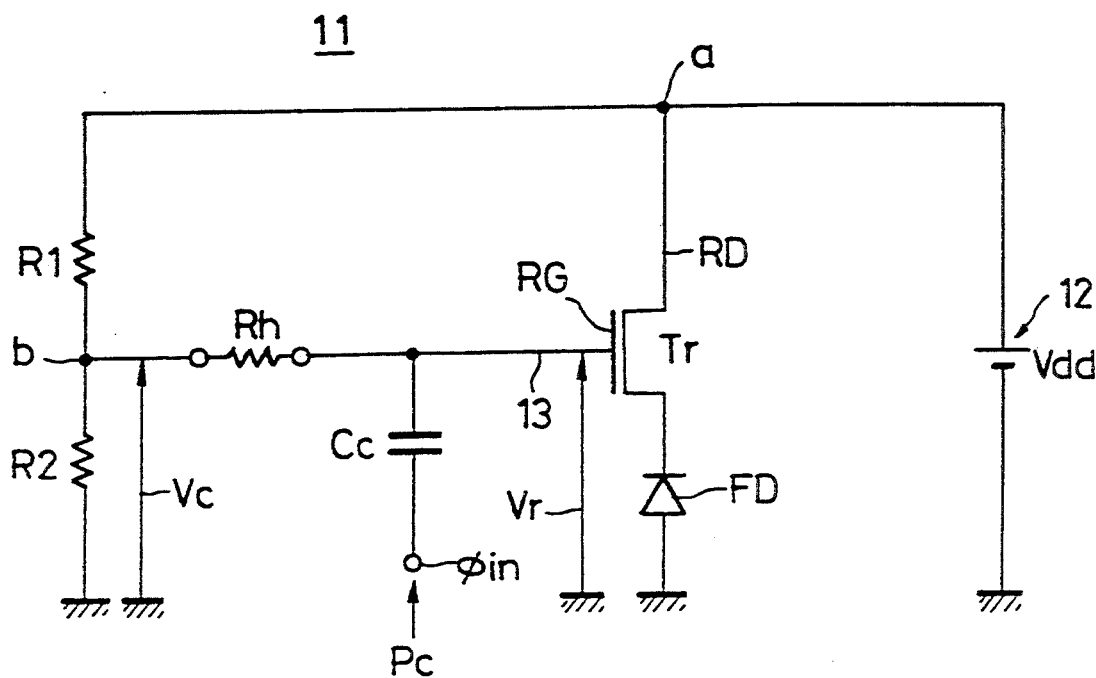
FIG. 4 is a circuit diagram showing a first example of a reset pulse forming circuit according to the embodiment of the present invention.

In the reset pulse forming circuit 11, as shown in FIG. 4, the drain voltage source 12 and the drain of the transistor Tr are connected via a junction a and two resistors R1, R2 are connected in series between an anode of the drain voltage source 12 and the ground. A junction b between the resistors R1 and R2 and the reset gate RG are connected via an input line 13, and a high resistance Rh is inserted into the input line 13. Further, a coupling capacitor Cc is connected between a clock pulse input terminal $\phi$in and the input line 13, thereby constructing the reset pulse forming circuit 11 according to this embodiment.

As is clear from the above-mentioned circuit arrangement, the reset pulse forming circuit 11 clamps an average value of clock pulses Pc supplied to the clock pulse input terminal $\phi$in to a junction potential Vc between the resistors R1 and R2. The junction potential Vc results from dividing the drain voltage Vdd by the resistors R1 and R2.

Figure 5:
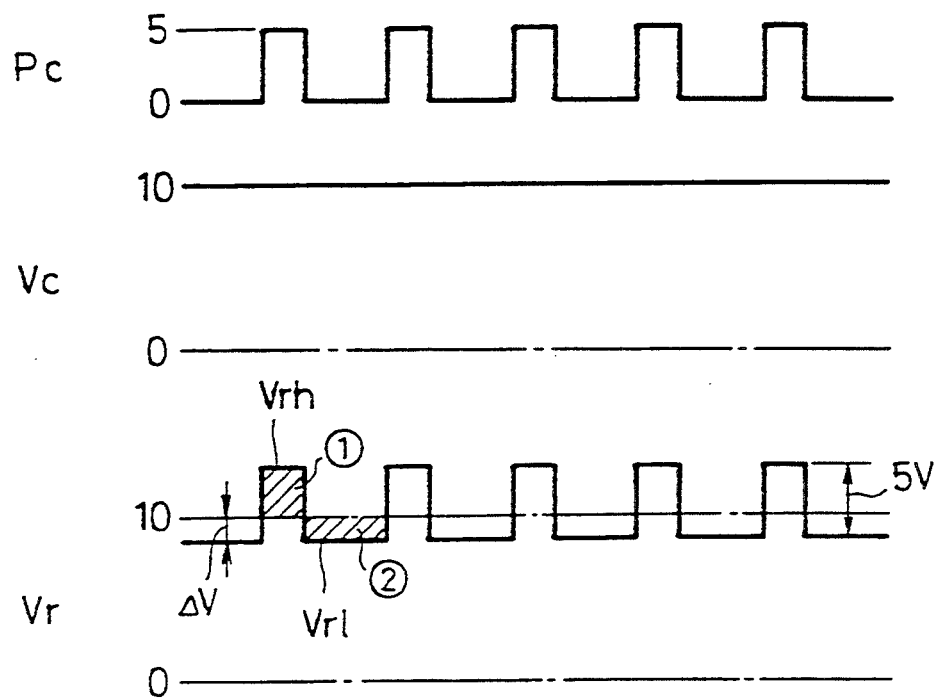
FIG. 5 is a diagram of waveforms of a clock pulse, a clamping potential and a voltage, and to which references will be made in explaining operation of the reset pulse forming circuit shown in FIG. 4.

Therefore, a waveform of the voltage Vr supplied to the reset gate RG is formed such that the clock pulse Pc is superimposed upon the clamp potential Vc and the clamp potential Vc is located between low level and high level of the clock pulse Pc as shown in FIG. 5. Further, as shown in FIG. 5, a potential integration (shown hatched by ①) formed between the clamp potential Vc and the high level of the clock pulse Pc and a potential integration (shown hatched by ②) formed between the clamp potential Pc and the clock pulse Pc present waveforms that are equal in value.

Assuming herein that ΔV is a potential difference between the clamp potential Vc and the low level of the superimposed clock pulse Pc, then a voltage Vrh defined by clamp potential Vc+high level of clock pulse Pc-potential difference ΔV is applied to the reset gate RG as high level and a voltage Vrl defined by clamp potential Vc-potential difference ΔV is applied to the reset gate RG as low level.

Therefore, assuming that the drain voltage Vdd is set to 15 V, for example, the clamp potential Vc is set to 10 V, high level of the clock pulse Pc is set to 5 V and that low level of the clock pulse Pc is set to 0 V, then a voltage Vrh lower than the drain voltage 15 V is applied to the reset gate RG as high level.

Figure 6:
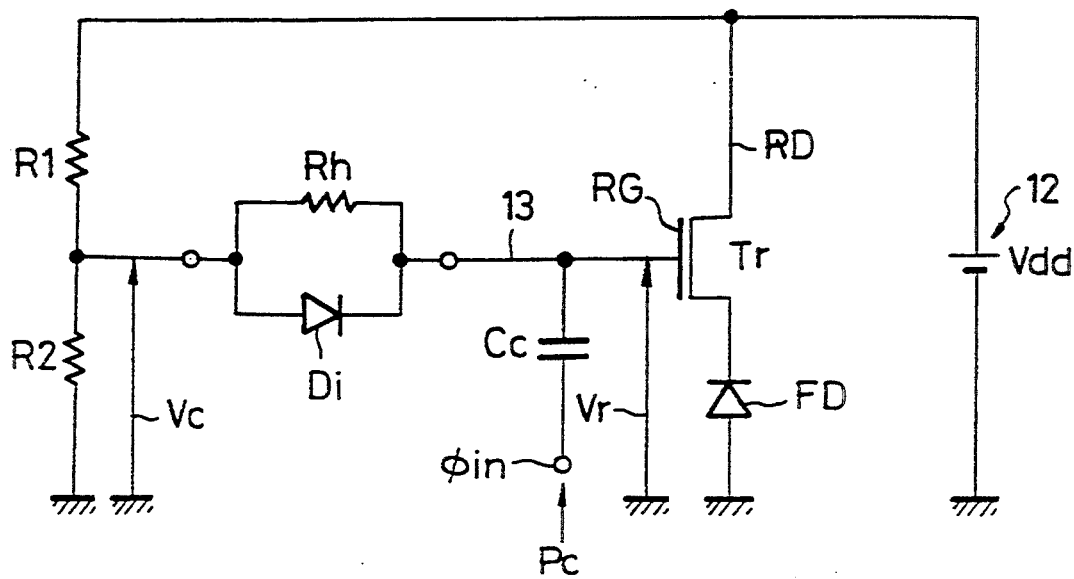
FIG. 6 is a circuit diagram showing a second example of the reset pulse forming circuit.

A second example of the reset pulse forming circuit 11 will be described with reference to FIG. 6. As shown in FIG. 6, a circuit of a high resistance Rh and a diode Di connected in parallel is inserted into the input line 13 of the reset gate RG instead of the high resistance Rh shown in FIG. 4.

Figure 7:
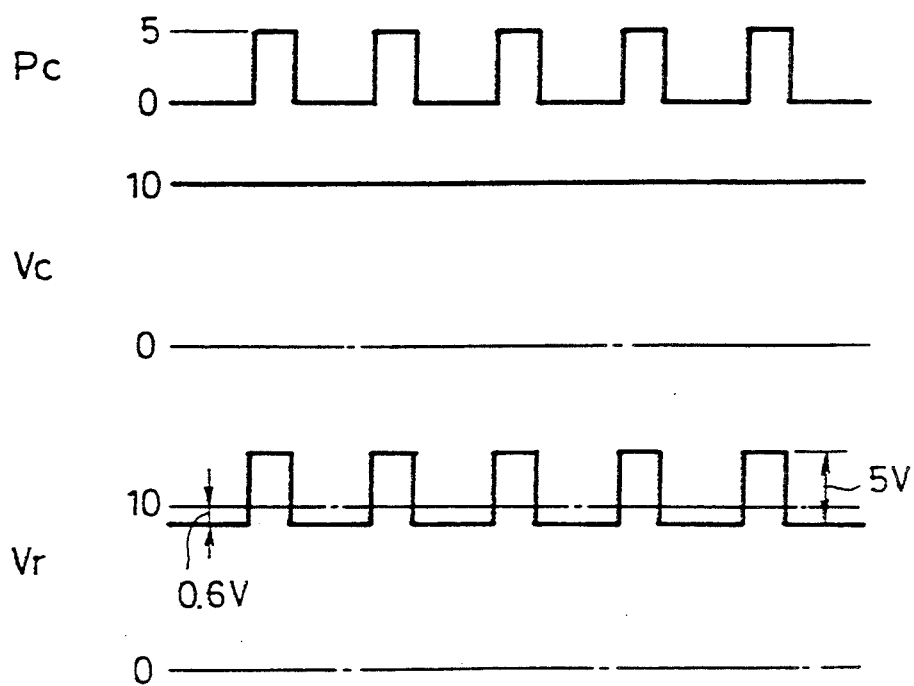
FIG. 7 is a diagram of waveforms of a clock pulse, a clamping potential and a voltage, and to which references will be made in explaining operation of the reset pulse forming circuit shown in FIG. 6.

In the case of the circuit arrangement shown in FIG. 6, the waveform of the voltage Vr supplied to the reset gate RG is formed such that, as shown in FIG. 7, the clock pulse Pc is superimposed upon the clamp potential Vc, the clamp potential Vc is located between low level and high level of the clock pulse Pc and that the low level of the clock pulse Pc is located at the position lower than the clamp potential Vc by an amount corresponding to a voltage drop, i.e., 0.6 V due to the presence of the diode Di. The high resistance Rh connected in parallel to the diode Di is used to determine the high level of the voltage Vr supplied to the reset gate RG.

Also in the reset pulse forming circuit shown in FIG. 6, the high level of the voltage Vr applied to the reset gate RG can be set to be lower than the level of the drain voltage Vdd similarly to the reset pulse forming circuit shown in FIG. 4.

Figure 8:
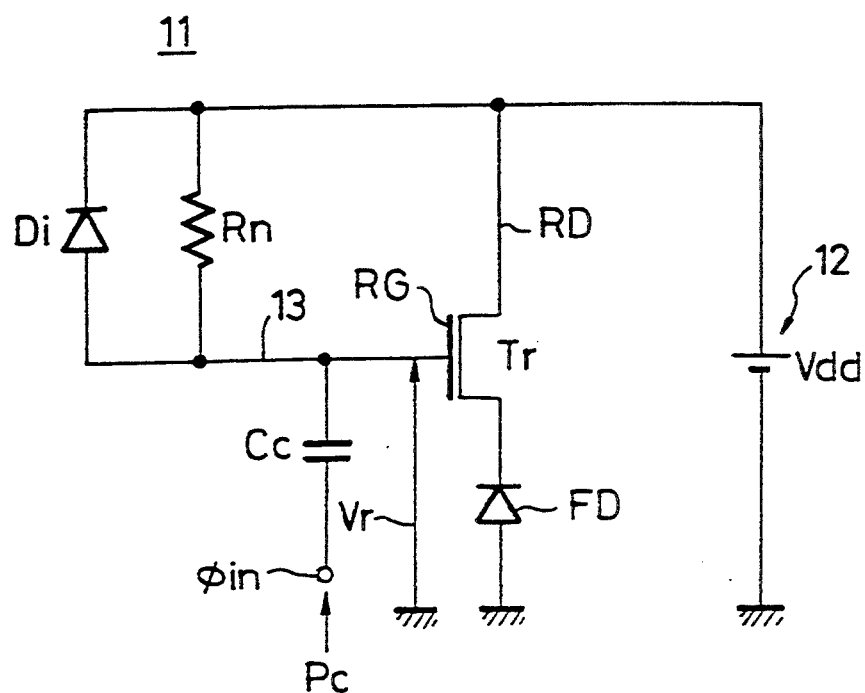
FIG. 8 is a circuit diagram showing a third example of the reset pulse forming circuit.

FIG. 8 shows a third example of the reset pulse forming circuit 11. In the example of the reset pulse forming circuit 11 shown in FIG. 8, the above-mentioned voltage dividing resistors R1 and R2 are removed and a parallel circuit of the high resistance Rh and the diode Di is connected between the input line 13 of the reset gate RG and the drain voltage source 12. In that case, the anode of the diode Di is connected to the reset gate RG side and the cathode thereof is connected to the drain voltage source 12 side.

Figure 9:
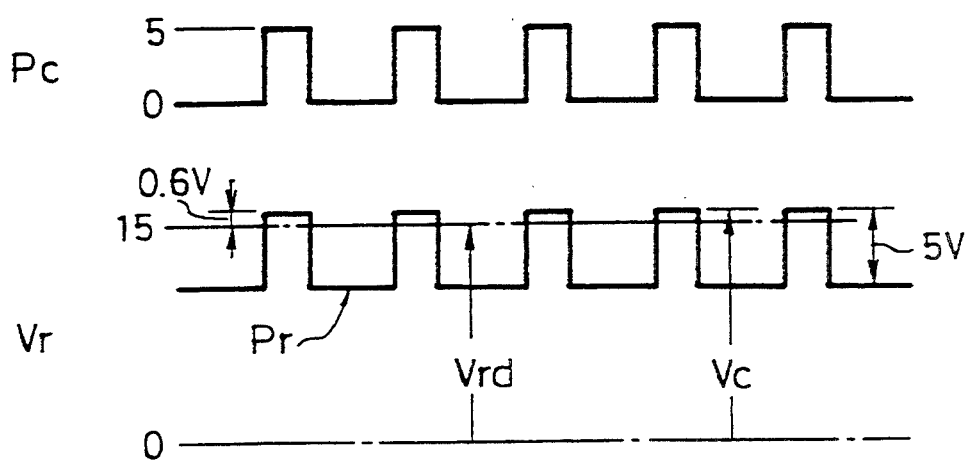
FIG. 9 is a diagram of waveforms of a clock pulse and a voltage, and to which references will be made in explaining operation of the reset pulse forming circuit shown in FIG. 8.

FIG. 9 shows a waveform of the clock pulse Pr and a waveform of the voltage Vr supplied to the reset gate RG, i.e., a waveform of the reset pulse Pr in the reset pulse forming circuit 11 shown in the third example of FIG. 8.

Figure 10:
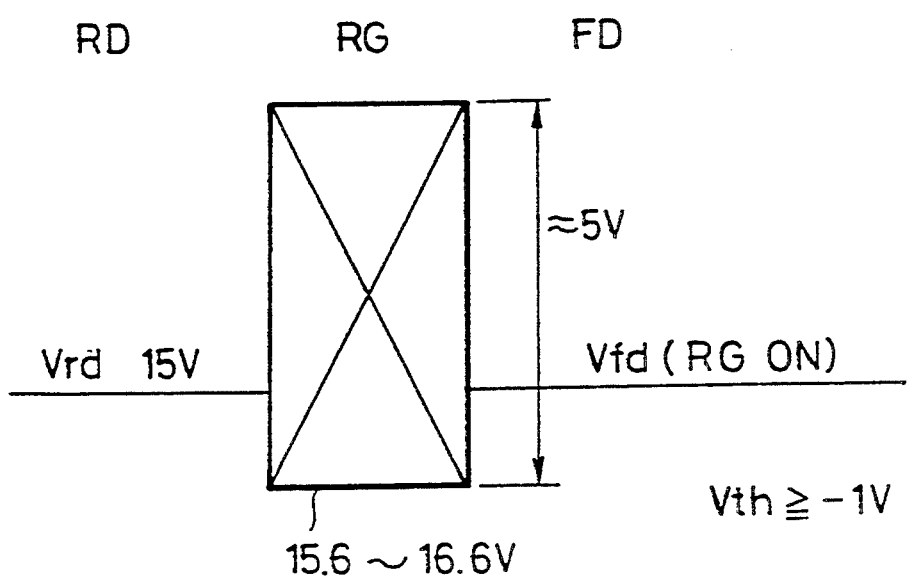
FIG. 10 is a potential diagram of potentials among a floating diffusion, a reset gate and a reset drain of the reset pulse forming circuit shown in FIG. 8.

FIG. 10 shows a potential diagram of potential supplied from the floating diffusion FD through the reset gate RG to the reset drain RD when the threshold voltage Vth is presented as Vth>−1 V. In FIG. 10, reference letter Vfd (when the reset gate RG is in its on-state) designates a potential of the floating diffusion FD when the MOSFET Tr is turned on.

As is clear from FIG. 9, the clamp potential Vc is set to a potential (in this example, Vrd+Vdi≈15.6 V) which results from adding a forward voltage Vdi of the diode Di to the potential Vrd (in this example, the potential Vrd is equal to the drain voltage Vdd and hence Vrd=15 V) of the reset drain RD. In other words, a potential on the side (high level side) in which the MOSFET Tr is turned on by the reset pulse Pr is fixed to a potential Vrd+Vdi.

According to the example shown in FIG. 8, as compared with the examples shown in FIGS. 4 and 6, since the high level side of the reset pulse Pr is directly clamped by the drain voltage Vdd through the diode Di without the voltage-dividing resistors R1 and R2, the fluctuation of the drain voltage Vdd is transmitted to the reset gate RG in a ratio of 1:1 (follow-up property is 1). Therefore, an amount that a potential formed under the reset gate RG is fluctuated when the drain voltage Vdd is fluctuated can be reduced. There is then the advantage that a room of an amplitude of the reset pulse Pr in which the fluctuated amount of the drain voltage Vdd is absorbed, i.e., so-called margin can be set to zero value (0 V) in actual practice. Consequently, the amplitude value of the reset pulse Pr can be set to an amplitude smaller than 5 V. In this embodiment, since the carrier concentration is determined so that the threshold voltage Vth is set to Vth>−1 V, the amplitude value of the reset pulse Pr may be set to 1 V+α at minimum from a principle standpoint.

As described above, according to the embodiment of the present invention, since the reset gate RG is formed of the MOSFET of depletion type and the channel region 7 formed under the reset gate RG is formed of the N-type impurity diffusion region whose carrier concentration is set in a range of from $10^{15}$ to $5 \times 10^{16}$ $cm^{-3}$, as compared with the prior art, the fluctuation of the amount of the implanted impurities can be reduced and the amount that the potential formed under the reset gate RG is fluctuated by the fluctuation of the amount of the implanted impurities can be reduced.

Further, since the reset pulse Pr that is supplied to the reset gate RG is formed by utilizing the drain voltage Vdd, the fluctuation of the drain voltage Vdd can be absorbed and the amount that the potential formed under the reset gate RG is fluctuated by the fluctuation of the drain voltage Vdd can be reduced.

Therefore, the amount that the potential formed under the reset gate RG is fluctuated by both the fluctuation of the amount of the implanted impurities and the fluctuation of the drain voltage Vdd can be reduced. Thus, the driving range of the reset gate RG can be reduced and a stable reset operation can be carried out.

Figure 11A:
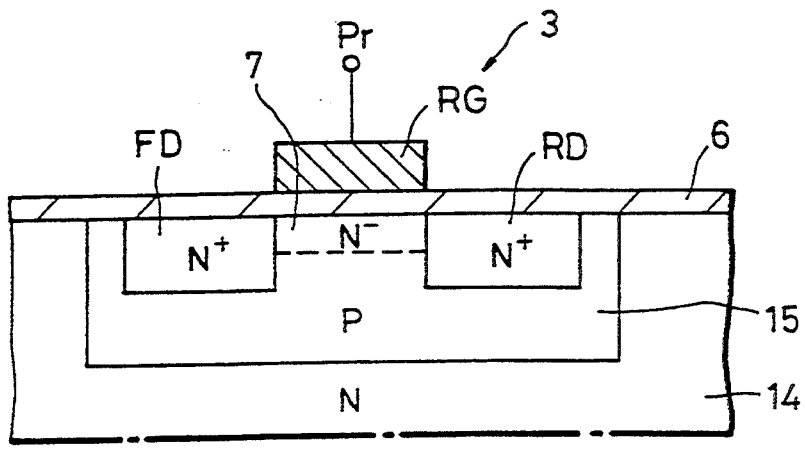
FIGS. 11A, 11B and 11C are respectively diagrams showing structures of examples of various kinds of discharge elements according to the embodiment of the present invention.

While the discharge element 3 composed of the floating diffusion FD, the reset gate RG and the reset drain RD is formed of the N-channel MOSFET of depletion type formed on the P-type silicon substrate 5 as described above, the present invention is not limited thereto and the following variants are also possible. That is, as shown in FIG. 11A, a P-type well region 15 is formed on an N-type silicon substrate 14 and the N-channel MOSFET of depletion type is formed on the P-type well region 15, thereby constructing the discharge element 3.

Figure 11B:
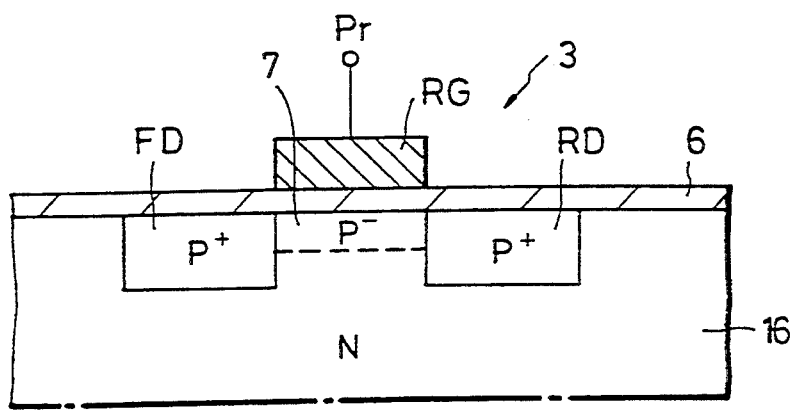
Figure 11C:
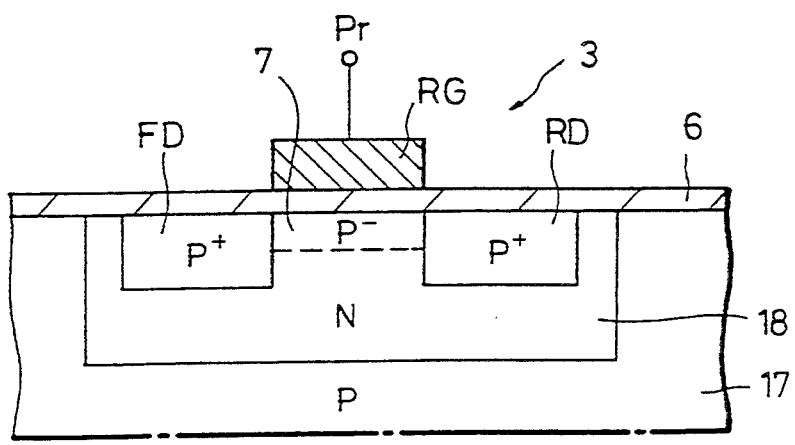

Further, when a hole is used as an electric charge, as shown in FIG. 11B, a P-channel MOSFET of depletion type is formed on an N-type silicon substrate 16 to thereby construct the discharge element 3. Furthermore, as shown in FIG. 11C, an N-type well region 18 is formed on a P-type silicon substrate 17 and the P-type MOSFET of depletion type is formed on the N-type well region 18, thereby constructing the discharge element 3.

According to the charge transfer apparatus of the present invention, the amount that the potential formed under the reset gate is fluctuated when the amount of implanted impurities and the drain voltage are fluctuated can be reduced. Therefore, the driving range of the reset gate can be reduced and the stable reset operation can be carried out.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A charge transfer apparatus comprising:
a charge transfer section for transferring signal charges in a direction;
an output diode having a first terminal connected to said charge transfer section and a second terminal connected to a first voltage, said output diode for receiving said signal charges from said charge transfer section;
amplifying means for receiving said signal charges from said output diode and outputting an output voltage corresponding to said signal charges;
an MIS transistor of a depletion type connected between said first terminal of said output diode and a voltage source, said MIS transistor having a gate terminal receiving a reset voltage thereby to reset said first terminal of said output diode to a predetermined potential; and
a clamp circuit comprising an input terminal receiving a reset pulse voltage, a condenser having a first node connected to said input terminal and a second node connected to said gate terminal, a resistance connected between said second node and said voltage source, and a clamp diode connected between said second node and said voltage source, said clamp circuit for clamping said reset pulse voltage at a clamp voltage level corresponding to a voltage level of said voltage source and outputting said reset pulse voltage to said gate terminal.

2. A charge transfer apparatus according to claims 1, wherein said MIS transistor has a channel of a carrier concentration in a range from $1 \times 10^{15}$ to $5 \times 10^{16}$ $cm^{-3}$.

3. A charge transfer apparatus according to claims 1, wherein said MIS transistor consists of an n-channel transistor.

4. A charge transfer apparatus according to claim 3, wherein said clamp diode includes an anode connected to said second node and a cathode connected to said voltage source.

5. A charge transfer apparatus comprising:
a charge transfer section for transferring signal charges in a direction;
an output diode having a first terminal connected to said charge transfer section and a second terminal connected to a first voltage, said output diode for receiving said signal charges from said charge transfer section;
amplifying means for receiving said signal charges from said output diode and outputting an output voltage corresponding to said signal charges;
reset means connected between said first terminal of said output diode and a voltage source, said reset means having a gate terminal receiving a reset voltage thereby to reset said first terminal of said output diode to a predetermined potential;
a clamp circuit having an input terminal receiving a reset pulse voltage, said clamp circuit for clamping said reset pulse voltage to a clamp voltage level corresponding to a voltage level of said voltage source and outputting said reset pulse voltage to said gate terminal,
wherein said clamp circuit comprises a condenser having a first node connected to said input terminal and a second node connected to said gate terminal, first and second resistances connected in series between said voltage source and a second voltage, a third node between said first and second resistances and a third resistance connected between said third node and said second node.

6. A charge transfer apparatus according to claim 5, further comprising a clamp diode connected between said third node and said second node.

7. A charge transfer apparatus as claimed in claim 5, wherein said reset means comprises a depletion type MIS transistor.

8. A charge transfer apparatus as claimed in claim 7, wherein said depletion type MIS transistor has a channel with a carrier concentration in a range from $1 \times 10^{15}$ to $5 \times 10^{16}$ $cm^{-3}$.

9. A reset circuit for a floating diffusion comprising:
a floating diffusion for accumulating signal charges therein;
reset means connected between said floating diffusion and a voltage source, said reset means having a gate terminal receiving a reset voltage thereby to reset said floating diffusion to a predetermined potential;

a clamp circuit having an input terminal receiving a reset pulse voltage, said clamp circuit for clamping said reset pulse voltage at a clamp voltage level corresponding to a voltage level of said voltage source and outputting said reset pulse voltage to said gate terminal, wherein said clamp circuit comprises a condenser having a first node connected to said input terminal and a second node connected to said gate terminal, a resistance connected between said second node and said voltage source, and a clamp diode which has an anode connected between said second node and said voltage source.

10. A reset circuit as claimed in claim 9, wherein said reset means comprises a depletion type MIS transistor which has a channel region with a carrier concentration in a range from $1 \times 10^{15}$ to $5 \times 10^{16}$ cm$^{-3}$.

11. A reset circuit for a floating diffusion comprising:

a floating diffusion for accumulating signal charges therein;

reset means connected between said floating diffusion and a voltage source, said reset means having a gate terminal receiving a reset voltage thereby to reset said floating diffusion to a predetermined potential;

a clamp circuit having an input terminal receiving a reset pulse voltage, said clamp circuit for clamping said reset pulse voltage at a clamp voltage level corresponding to a voltage level of said voltage source and outputting said reset pulse voltage to said gate terminal, wherein said clamp circuit comprises a condenser having a first node connected to said input terminal and a second node connected to said gate terminal, first and second resistances connected in series between said voltage source and a second voltage, a third node between said first and second resistances, and a third resistance connected between said third node and said second node.

12. A reset circuit according to claim 11, further comprising a clamp diode connected between said third node and said second node.

13. A reset circuit as claimed in claim 11, wherein said reset means comprises a depletion type MIS transistor.

14. A reset circuit as claimed in claim 13, wherein said depletion type MIS transistor has a channel region with a carrier concentration in a range from $1 \times 10^{15}$ to $5 \times 10^{16}$ cm$^{-3}$.

15. A charge transfer apparatus comprising:

a charge transfer section for transferring signal charges in a direction;

an output diode having a first terminal connected to said charge transfer section and a second terminal connected to a first voltage, said output diode for receiving said signal charges from said charge transfer section;

amplifying means for receiving said signal charges from said output diode and outputting an output voltage corresponding to said signal charges;

reset means connected between said first terminal of said output diode and a voltage source, said reset means having a gate terminal receiving a reset voltage thereby to reset said first terminal of said output diode to a predetermined potential; and a clamp circuit having an input terminal receiving a reset pulse voltage, said clamp circuit for clamping said reset pulse voltage at a clamp voltage level corresponding to a voltage level of said voltage source and outputting said reset pulse voltage to said gate terminal, wherein said clamp circuit comprises a condenser having a first node connected to said input terminal and a second node connected to said gate terminal, a resistance connected between said second node and said voltage source, and a clamp diode which has an anode connected between said second node and said voltage source.

16. A charge transfer apparatus as claimed in claim 15, wherein said reset means comprises a depletion type MIS transistor which has a channel with a carrier concentration in a range from $1 \times 10^{15}$ to $5 \times 10^{16}$ cm$^{-3}$.

* * * * *